United States Patent [19]

Sprague et al.

[11] 4,428,647
[45] Jan. 31, 1984

[54] MULTI-BEAM OPTICAL SYSTEM USING LENS ARRAY

[75] Inventors: Robert A. Sprague, Saratoga; Donald R. Scifres, Los Altos, both of Calif.

[73] Assignee: Xerox Corporation, Stamford, Conn.

[21] Appl. No.: 439,255

[22] Filed: Nov. 4, 1982

[51] Int. Cl.³ ............................ G01J 1/08; G03H 1/22
[52] U.S. Cl. ................................. 350/167; 250/494.1; 350/372
[58] Field of Search ...................... 350/167, 96.31, 3.6, 350/3.7, 3.72, 3.73, 162.13; 250/494.1

[56] References Cited

U.S. PATENT DOCUMENTS

| | | | |
|---|---|---|---|
| 3,734,599 | 5/1973 | Feldman | 350/190 |
| 3,785,736 | 1/1974 | Spitz et al. | 350/162.13 |
| 4,264,130 | 4/1981 | Ogora | 350/96.31 |

OTHER PUBLICATIONS

Crow, et al., "Gallium Arsenide Laser-Array-on-Silicone Package", Applied Optics, vol. 17, No. 3, Feb. 1, 1978, pp. 479-485.

*Primary Examiner*—Bruce Y. Arnold
*Attorney, Agent, or Firm*—Leonard Zalman

[57] ABSTRACT

Each laser of a semiconductor laser array of an optical system has its own lens mounted adjacent to it in the space between the laser array and the objective lens of the system. The purpose of the lenses is to change the angle of divergence of the light beams leaving the emitting surface of the laser array so that the light beams can be collected efficiently by the objective lens, thereby providing significant beam power at the light sensitive medium (optical disk, photoconductor, etc.) of the optical system. The focusing power of each lens is chosen to form virtual images behind the emitting surface with spacings approximately corresponding to the spacings of the light beams emitted by the laser array, but with the emitter image size substantially magnified.

6 Claims, 6 Drawing Figures

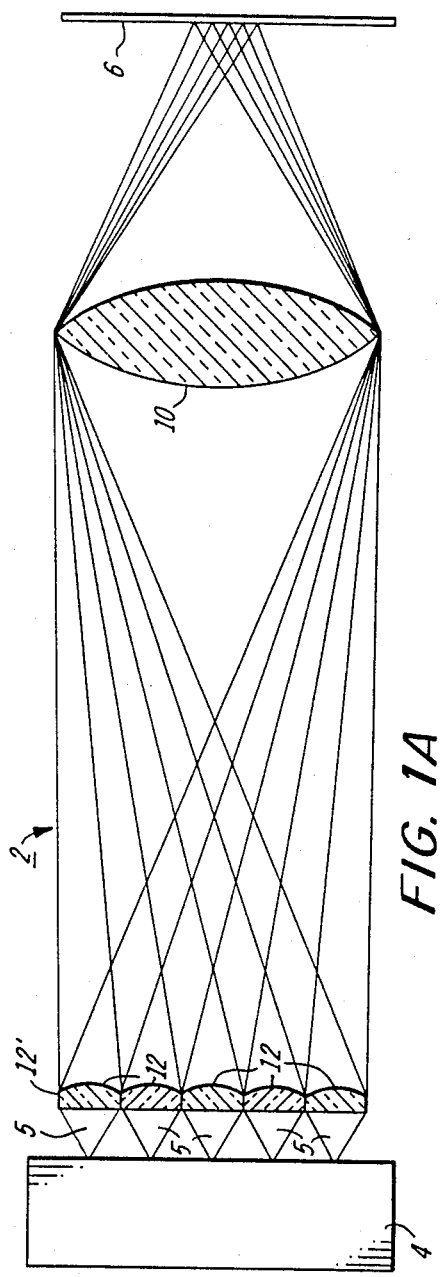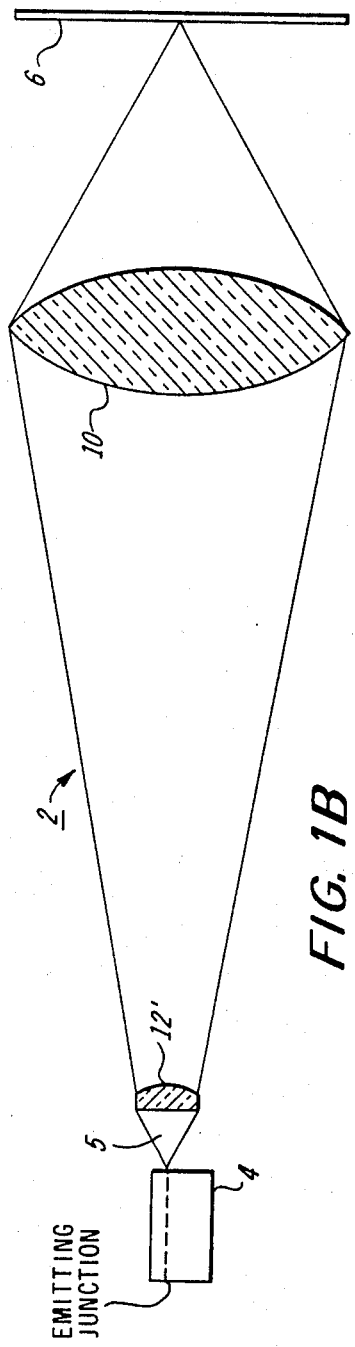

MULTI-BEAM OPTICAL SYSTEM USING LENS ARRAY

BACKGROUND OF THE INVENTION

Multiple diode lasers positioned adjacent to each other on a common semiconductor substrate (laser array) can function as the light source in various optical systems. For example, a wideband optical disk recorder could be constructed in which each diode of a laser array is used to write one data track on the optical disk. If the laser array has N lasers, then the required bandwidth for each track is reduced by a factor of 1/N, thus providing an extremely attractive wideband system.

In the exemplary case of a wideband optical disk recorder, data track spacing on the order of 0.002 mm is desired. Currently available semiconductor technology can provide a laser array with a laser spacing limit, due, in part, to thermal interaction effects, of only about 0.25 mm. The light beams provided by such an array would have a large divergence angle. Because the spacing of the lasers from each other is substantially larger than the desired track, or beam spot, spacing at the optical disk, the laser array must be located at a substantial distance from the focusing objective lens of the system to provide enough demagnification to provide the proper beam spot spacing. The substantial distance between the laser array and the objective lens, and the large divergence angle of the emitted light beams, causes the amount of light collected by the objective lens to be very small, that is, a significant amount of beam power is lost, making such systems impractical.

SUMMARY OF THE INVENTION

In accordance with the invention, each laser of a semiconductor laser array of an optical system has its own lens mounted adjacent to it in the space between the laser array and the objective lens of the system. The purpose of the lenses is to change the angle of divergence of the light beams leaving the emitting surface of the laser array so that the light beams can be collected efficiently by the objective lens, thereby providing significant beam power at the light sensitive medium (optical disk, photoconductor, etc.) of the optical system. The focusing power of each lens is chosen to form virtual images behind the emitting surface with spacings approximately corresponding to the spacings of the light beams emitted by the laser array, but with the emitter image size substantially magnified.

BRIEF DESCRIPTION OF THE DRAWINGS

FIGS. 1A and 1B are plane views of an optical system in accordance with the invention.

DETAILED DESCRIPTION OF THE DRAWINGS

The invention will be described in the environment of a multi-channel optical disk recorder, however, the invention is applicable to any system, such as, laser non-impact printing systems, laser annealing systems, or laser etching systems, where it is desired to provide light beams of significant power at a photosensitive surface at spacing less than the spacings of the light beams emitted by a laser array. Even overlapped or concentric light beams can be formed.

Figure 3:
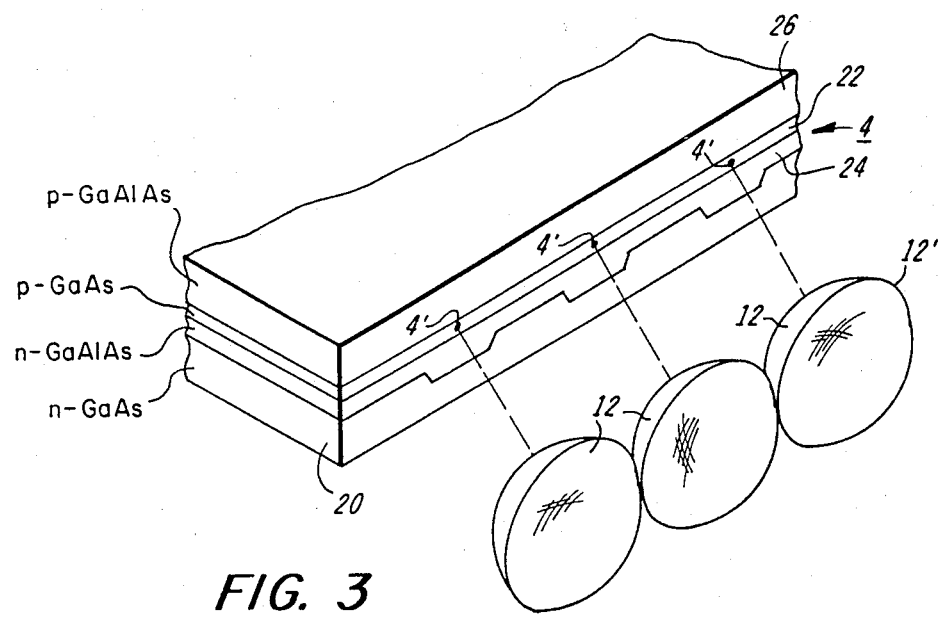
FIG. 3 is a perspective view of one type of laser array that can be used in the optical system of FIG. 1.

Referring now to FIGS. 1, there is shown a set of optics 2 which utilizes a laser array 4 to change the optical characteristics of data tracks of a photosensitive recording medium 6 such as utilized in an optical disk recorder. Laser array 4 can be any conventional solid state type. One example of array 4, shown in perspective in FIG. 3, uses a channeled substrate 20 and an active layer 22 sandwiched between cladding layers 24 and 26 to provide a plurality of lasers 4'. Each of the lasers 4' would have its own current drive to provide a plurality of output light beams 5, as shown in FIG. 1. Each of the current drives can be modulated or unmodulated depending upon the desire to have its corresponding laser emit a light beam 5 which is modulated or unmodulated. Typically, the light beams 5 would be spaced 0.25 mm apart at their emission points from array 4. Due to the point source nature of the light beams 5, those beams typically have a large divergence angle, as shown.

Recording medium 6 is typically a light level sensitive recording material which, typically, is a disk rotated during operation (by means not shown) at an essentially constant velocity. For example, for an optical disk system, recording medium 6 suitably comprises an ablatable tellerium based, reflective film which is coated on an optically transparent substrate, such as glass or plastic. In that event, the power of the light beams 5, as controlled by the current drivers, is selected such as to swing above and below the ablation threshold of the film.

Figure 2:
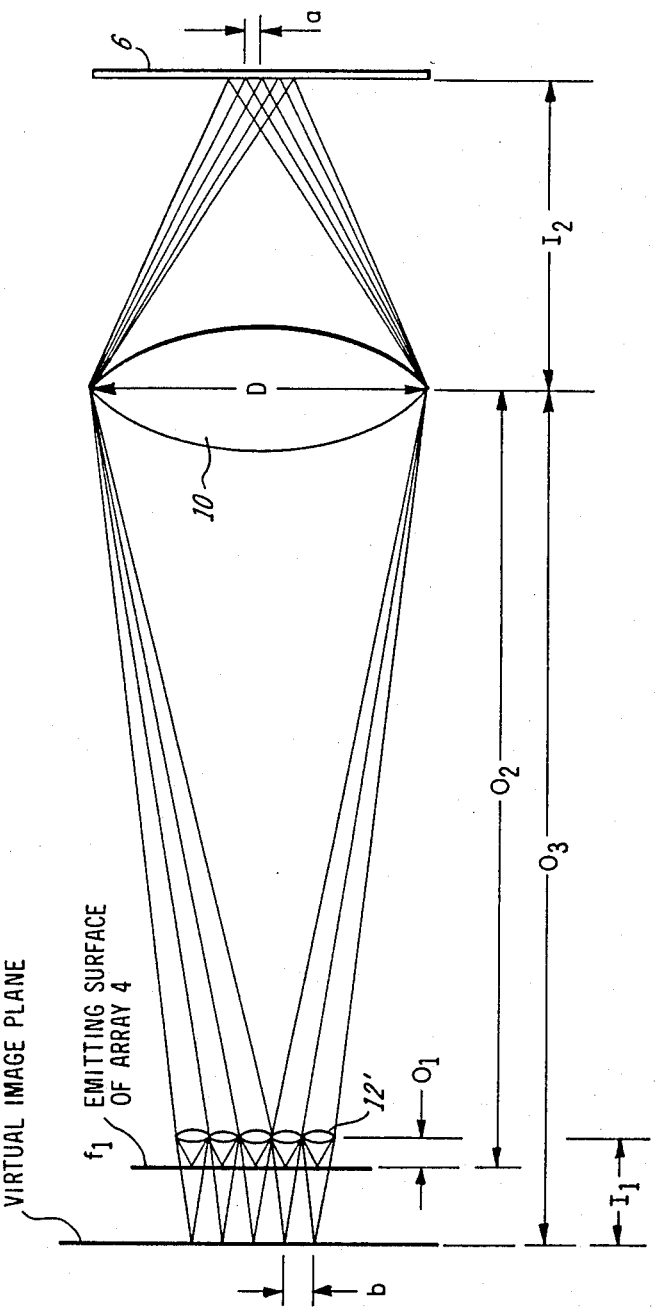
FIG. 2 depicts the formation of virtual images by the optical system of FIG. 1.

Referring further to FIG. 1, disposed in the space between medium 6 and laser array 4 is a focusing objective lens 10. Because the spacing of the lasers 4' from each other, typically 0.25 mm, is substantially larger than the desired track or light spot spacing on the recording medium, typically 0.002 mm, the laser array 4 must be located a substantial distance from the focusing objective lens 10 to provide enough demagnification to achieve the desired track or light spot spacing. Referring now to FIG. 2, without use of a lens array the location of objective lens 10 relative to laser array 4 is governed by the magnification equation $$a/b = I_2/O_2, \qquad (1)$$

where a is the spacing between the tracks or light spots on the recording medium 6, b is the spacing between the laser diodes 4' of the laser array 4, $I_2$ is the distance from the focusing objective lens 10 to the recording medium 6, and $O_2$ is the distance from the focusing objective lens 10 to the emitting surface of the laser array 4.

Given the substantial distance $O_2$ that is required to achieve the desired demagnification for realistic system parameters, the portion of the amount of light collected by objective lens 10 from a laser array emitting light beams 5 with a large divergence angle would be very small. In accordance with the invention, that problem is rectified by mounting each laser 4' behind its own lens 12. Each lens 12 changes the divergence angle of the light beam 5 from its associated laser 4' so that a large portion of each light beam 5 is collected by the objective lens 10, as shown in FIG. 2. As noted, there are as many lenses 12 as there are lasers 4'. A single lens for all the lasers 4' would change the divergence angle(s) of beams 5, but a single lens would also magnify the apparent spacing between the light sources in a corresponding manner so that the light beams would not have the desired close spacing on the recording medium 6.

The focusing power of each lens 12 is chosen so that the lenses 12 project a virtual image of each light emitting point from the laser array to the left of the actual location of the laser array 4, as shown in FIG. 2, with approximately the same spacing of virtual images as achieved by the laser array 4 itself. In more elemental terms, each lens 12 makes the light rays emitted from its associated laser 4' appear to diverge from a point behind (to the left in FIG. 2) the actual location of the emitting surface of the laser array 4. By projecting the virtual images far enough to the left, substantially all of the light collected by each lens 12 will enter the objective lens 10 on the right. If it is assumed for the purpose of calculation that the lenses 12 are abutting, the formula used to select the location of the lens array 12' is thus given by $$b/I_1 = D/O_3, \quad (2)$$

where $I_1$ is the distance between the lens array 12' and the virtual image plane, b is the laser spacing, D is the aperture of objective lens 10, and $O_3$ is the spacinng between the objective lens 10 and the virtual image plane.

The numericl aperture of each lenses 12 of the lens array 12' is chosen to collect as much of the light from its associated beam 5 as possible, resulting in the object distance $O_1$ between the lens array 12' and the emitting surface of the laser array 4 being $$O_1 = b/2NA, \quad (3)$$

where NA is the numerical aperture of each lens 12.

Calculating the image distance $I_1$ from equation (2), and the object distance $O_1$ from equation (3), permits calculation of the focal length of the lenses 12 of the lens array 12' according to the lens equation $$1/I_1 + 1/O_1 = 1/f_1 \quad (4)$$

where $f_1$ is the focal length of the lenses 12 of the lens array 12'. Note that the virtual image distance $I_1$ is negative in equation (4).

A set of practical system parameters is listed as follows:
- b = 0.25 mm. = laser spacing
- a = 0.002 mm. = desired spot spacing on disk 6
- $I_2$ = 4.5 mm. = distance from objective 10 to disk 6
- $O_3$ = 562.5 mm. = distance from objective lens 10 to virtual image plane
- D = 4.5 mm. = objective lens 10 aperture
- $I_1$ = 31.25 mm. = distance from lens array 12' to virtual image plane $O_1$ = 0.25 mm. = distance from lens array 12' to emitting surface of diode array 4
- $f_1$ = 0.248 mm. = focal length of lens array The parameters b, a, $I_2$, and D are selected based on obtainable hardware, while the other parameters are calculated from equations (2), (3) and (4).

The lens array 12 can be, for example, a "fly's eye" array, as shown in FIGS. 1 and 2. Lenses with different focal lengths in different axes (cylindrical symmetry) may also be used to shape the laser beams and to compensate for laser astigmatism. Such arrays of both types are made, for example, of plastic or glass and are commercially available. Such lenses might also be fabricated directly on the emitting surface of the laser array.

Figure 5:
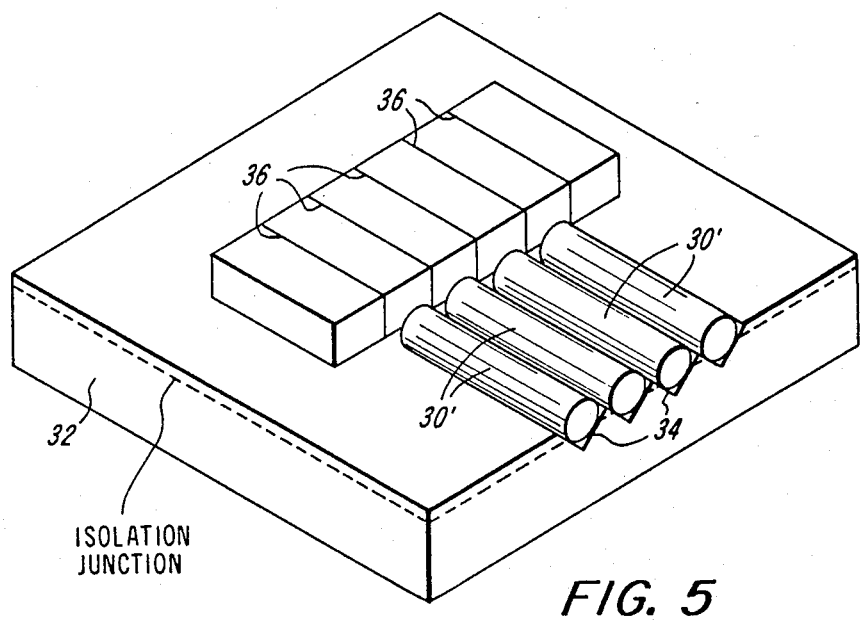
FIGS. 4 and 5 depict different types of lens arrays that can be used in the optical system of FIGS. 1.
Figure 4:
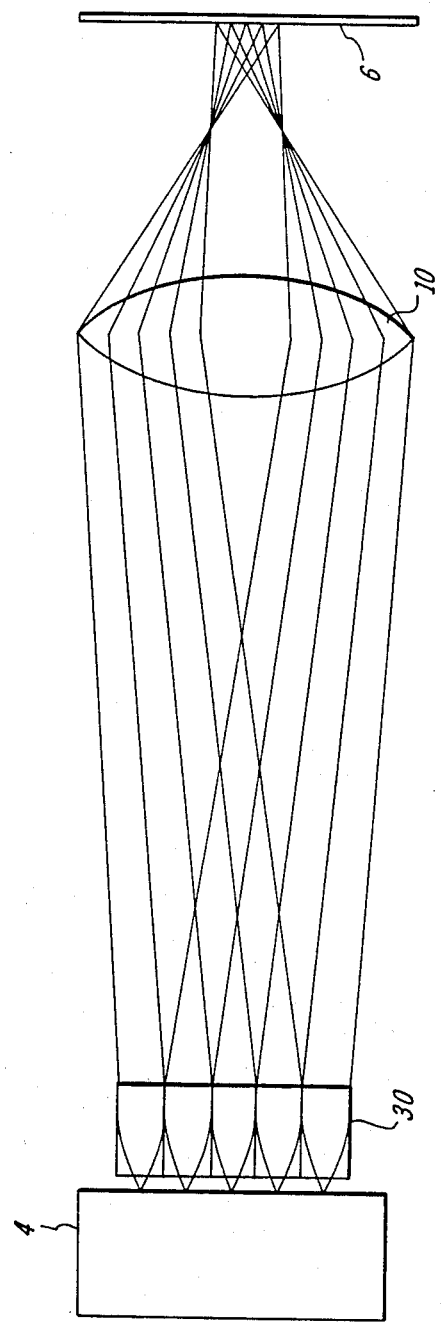

A commercially available alternative to a fly's eye array would be, as shown in FIG. 4, an array 30 of a plurality of glass or synthetic resin light conducting fibers in a linearly bundled configuration. Such optical fibers are sold under the tradename "SELFOC" and have a refractive index distribution in cross-section that varies parabolically outward from the center portion thereof. The fibers are arranged in a side by side relationship and parallel with one another in a bundled configuration, the fibers being maintained in that configuration by a suitable bonding material. Bonding of a SELFOC array can be avoided by providing, by means of isolation saw cuts 36, a laser array 4 on a silicon substrate 32, as shown in FIG. 5. V-grooves 34 are provided in the substrate in a well known manner, with such grooves aligning individual SELFOC fibers 30' which could be independently focused. An array of holographic elements could also be used as the lens array 12.

We claim:

1. An optical system comprising a laser array operable to emit from an emitting surface a plurality of output light beams of a set spacing and divergence angle, an objective focusing lens located at a substantial distance from said emitting surface for focusing said output beams at a surface with a spcing substantially different than said set spacing, and lens means located in the optical path between said emitting surface and said objective lens for changing the divergence angle of each of said output light beams independently of the beam spacing as seen by said objective lens, whereby a large portion of each of said output light beams is collected by said objective lens.

2. The optical system of claim 1 wherein said lens means is an array of lenses, each lens of said array being associated with a different one of said output light beams.

3. The optical system of claim 2 wherein said array of lenses is a "fly's eye" array.

4. The optical system of claim 2 wherein said array of lenses is a configuration of light conducting fibers having a graded refractive index distribution.

5. The optical system of claim 2 wherein said array of lenses is located directly on said emitting surface.

6. The optical system of claim 1 wherein said array of lenses is an array of holographic elements.

* * * * *